(12) United States Patent
Strauss et al.

(10) Patent No.: US 7,345,313 B2
(45) Date of Patent: Mar. 18, 2008

(54) NITRIDE-BASED SEMICONDUCTOR COMPONENT SUCH AS A LIGHT-EMITTING DIODE OR A LASER DIODE

(75) Inventors: Uwe Strauss, Bad Abbach (DE); Andreas Weimar, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/493,914

(22) PCT Filed: Oct. 28, 2002

(86) PCT No.: PCT/DE02/04026

§ 371 (c)(1),
(2), (4) Date: Nov. 9, 2004

(87) PCT Pub. No.: WO03/038913

PCT Pub. Date: May 8, 2003

(65) Prior Publication Data

US 2005/0072982 A1   Apr. 7, 2005

(30) Foreign Application Priority Data

Oct. 26, 2001   (DE) .................. 101 52 922

(51) Int. Cl.
*H01L 33/00*   (2006.01)

(52) U.S. Cl. ..................................... 257/84

(58) Field of Classification Search .............. 257/76, 257/79, 84, 85
See application file for complete search history.

(56) References Cited

U.S. PATENT DOCUMENTS

| 5,210,051 | A | | 5/1993 | Carter, Jr. | |
|---|---|---|---|---|---|
| 5,260,588 | A | * | 11/1993 | Ohta et al. | 257/93 |
| 5,874,747 | A | | 2/1999 | Redwing | |
| 6,185,238 | B1 | | 2/2001 | Onomura et al. | |
| 6,242,761 | B1 | * | 6/2001 | Fujimoto et al. | 257/94 |
| 2001/0022367 | A1 | | 9/2001 | Bando et al. | |
| 2001/0032985 | A1 | * | 10/2001 | Bhat et al. | 257/88 |
| 2002/0053665 | A1 | * | 5/2002 | Tsuda et al. | 257/14 |
| 2003/0107053 | A1 | * | 6/2003 | Uemura et al. | 257/200 |
| 2003/0164502 | A1 | | 9/2003 | Baur et al. | |

FOREIGN PATENT DOCUMENTS

| DE | 101 07 472 A1 | 12/2001 |
|---|---|---|
| EP | 0 892 443 A2 | 1/1999 |
| EP | 1 278 249 A1 | 3/2001 |
| JP | 09107125 | 4/1997 |
| JP | 11177134 | 7/1999 |
| WO | WO 01/47036 A1 | 6/2001 |
| WO | WO 01 73858 | 10/2001 |

* cited by examiner

*Primary Examiner*—Thomas L. Dickey
(74) *Attorney, Agent, or Firm*—Cohen Pontani Lieberman & Pavane LLP

(57) ABSTRACT

A nitride-based semiconductor component having a semiconductor body (1) with a contact metalization (4) applied thereon. The semiconductor body (1) is provided with a protective layer which, if appropriate, also covers partial regions of the contact metalization (4) and which has a plurality of recesses (5) arranged near to one another.

19 Claims, 5 Drawing Sheets

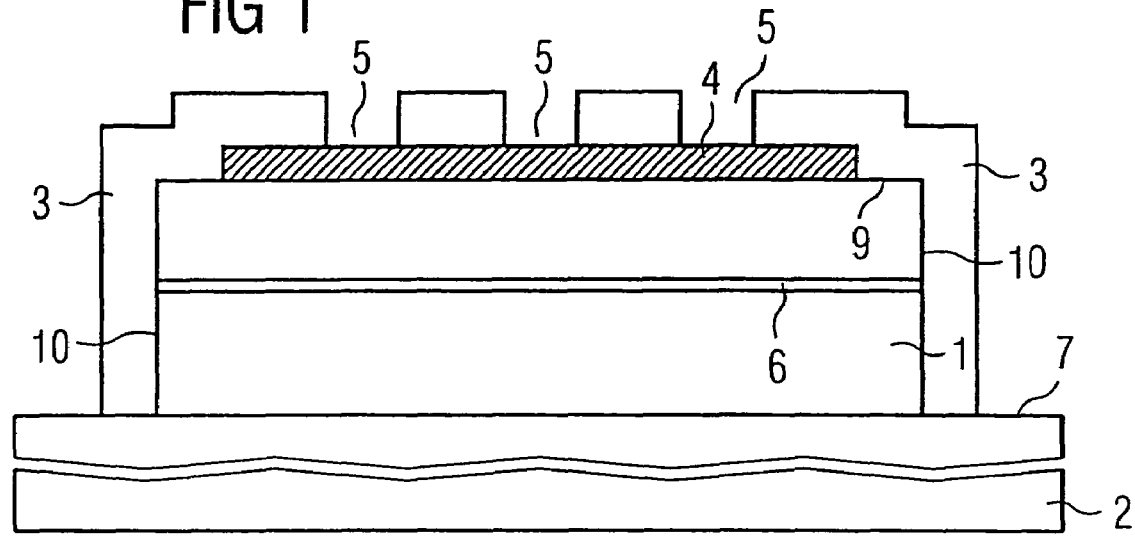
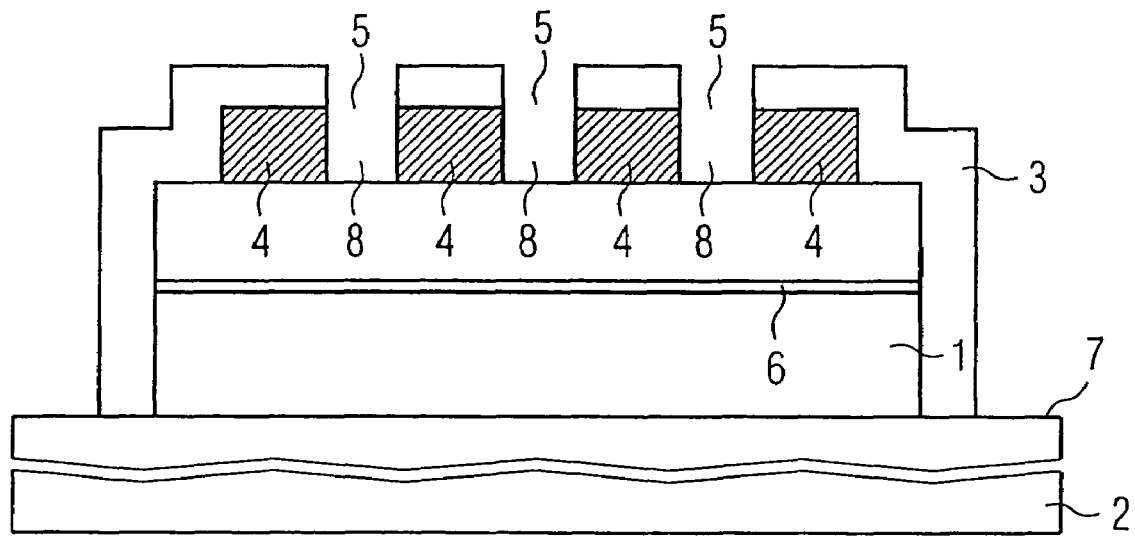

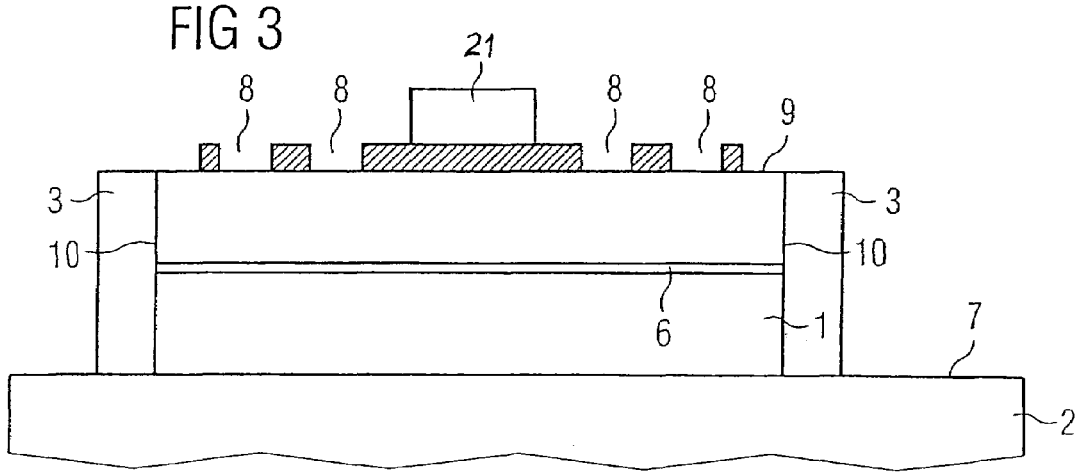
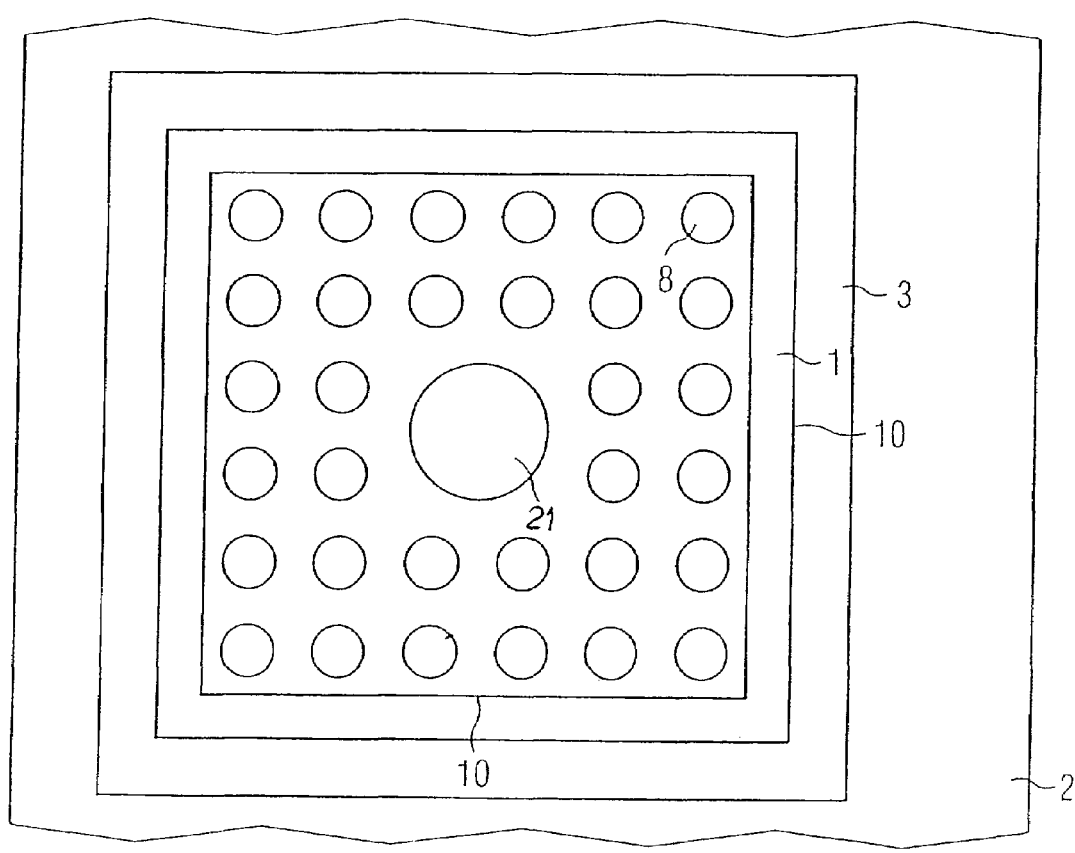

NITRIDE-BASED SEMICONDUCTOR COMPONENT SUCH AS A LIGHT-EMITTING DIODE OR A LASER DIODE

RELATED APPLICATIONS

This is a U.S. National Stage of International Application Ser. No. PCT/DE02/04026 filed on 28 Oct. 2002.

This patent application claims priority of German patent application No. 10152922.8 filed 26 Oct. 2001.

FIELD OF THE INVENTION

The invention relates to a nitride-based semiconductor component having a semiconductor body containing a nitride compound semiconductor, a contact metalization and a protective layer arranged on the contact metalization.

BACKGROUND OF THE INVENTION

Semiconductor components of the aforementioned type are described for example in U.S. Pat. No. 5,210,051, which discloses a semiconductor chip for a light-emitting diode. The semiconductor chip comprises an SiC substrate, on which an n-conducting and subsequently a p-conducting gallium nitride layer are applied. A radiation-generating pn junction is formed between the p-conducting layer and the n-conducting layer, and emits blue or violet light during operation. A contact metalization is applied on the p-conducting layer.

Such a semiconductor chip is generally provided with a protective layer. Said protective layer serves, in particular, for protecting the contact metalization from corrosion and mechanical damage, for example scratches. Moreover, electrical flashovers at the surface of the semiconductor body are suppressed. Such flashovers may primarily occur at the locations of the surface at which the pn junction is uncovered.

However, such a protective layer may greatly impair the electrical properties of the component. Thus, for forward-biased gallium-nitride-based light-emitting diodes, an increase in the forward voltage by more than 100% was ascertained in comparison with a component of the same type without a protective layer. This consequently led to a significant increase in the heat loss or the temperature of the component with a protective layer, and finally to the total failure thereof due to thermal overloading.

SUMMARY OF THE INVENTION

It is one object of the present invention to provide a component of the type mentioned in the introduction with an improved protective layer.

This and other objects are attained in accordance with one aspect of the present invention directed to a semiconductor component having a semiconductor body containing a nitride compound semiconductor, a contact metalization and a protective layer arranged on the contact metalization, the protective layer having a plurality of recesses.

Another aspect of the present invention is directed to a semiconductor component comprising a semiconductor body containing a nitride compound semiconductor with a pn junction and a contact metalization, the pn junction being laterally bounded by side areas of the semiconductor body. The semiconductor body is provided with a protective layer arranged in such a way that the pn junction uncovered at the side areas is at least partly covered with the protective layer.

In this case, a nitride compound semiconductor is to be understood as, in particular, nitride compounds of elements of the third and/or fifth main group of the periodic table, for example GaN, AlN, InN, $Al_xGa_{1-x}N$, $0 \leq x \leq 1$, $In_xGa_{1-x}N$, $0 \leq x \leq 1$ or $Al_xIn_yGa_{1-x-y}N$, $0 \leq x \leq 1$, $0 \leq y \leq 1$, $0 \leq x+y \leq 1$.

It has been found that hydrogen in the region of the interface between semiconductor body and contact metalization leads to a disadvantageous increase in the forward voltage of the component. If the semiconductor body is provided with a conventional closed protective layer, the hydrogen situated in the semiconductor body cannot escape, accumulates for example at the interface between semiconductor body and contact metalization and consequently impairs the contact resistance or increases the forward voltage.

In the case of the invention, by contrast, the protective layer is permeable to hydrogen on account of the recesses or the only partial coverage of the semiconductor body, so that hydrogen can escape from the semiconductor body. This advantageously brings about a significantly lower forward voltage.

A silicon oxide layer or a silicon nitride layer is preferably used as the protective layer. In the case of the invention, metal layers containing platinum or palladium are suitable, for example, as the contact metalization. More widely, it is also possible to use gold- or nickel-containing metalizations or palladium-gold or palladium-nickel alloys.

In an advantageous refinement of the invention, the contact metalization is embodied in hydrogen-permeable fashion. In a first variant in this respect, the contact metalization has a plurality of recesses arranged near to one another. This reduces the proportion of the surface of the semiconductor body that is covered by the contact metalization, and correspondingly increases the proportion of the free semiconductor surface through which hydrogen can escape. This advantageously leads to a lower forward voltage of the component. In the case of radiation-emitting components, a further advantage consists in the fact that the radiation efficiency also increases on account of the reduced coverage of the semiconductor surface with the contact metalization.

In a second variant of a hydrogen-permeable contact metalization, the contact metalization is made so thin that hydrogen can pass through it.

In this case, thin, unpatterned contact metalizations of the second variant are distinguished by a lower production effort, while thicker contact layers in accordance with the first variant are comparatively robust and, if appropriate, do not have to be protected from mechanical damage by additional means such as a protective layer, for example. It goes without saying that it is also possible to combine the two variants in the form of a thin contact metalization with a plurality of recesses.

By way of example, a platinum layer or a palladium layer having a thickness of between 5 nm and 20 nm may be used as the thin, hydrogen-permeable contact layer. By contrast, thicker contact layers patterned with recesses may have a thickness of up to several micrometers.

The invention is suitable in particular for radiation-emitting semiconductor components, for example light-emitting diodes. The patterned protective layer and the patterned or thinly made contact metalization entails the additional advantage of an increased radiation efficiency, as already described. Furthermore, by way of example, laser diodes are operated with a comparatively high current, so that a reduction of the forward voltage has a particularly advantageous effect with regard to the resulting heat loss and temperature loading.

BRIEF DESCRIPTION OF THE DRAWINGS

FIG. 1 shows a diagrammatic sectional illustration of a first exemplary embodiment of a component according to the invention, FIG. 2 shows a diagrammatic sectional illustration of a second exemplary embodiment of a component according to the invention, FIG. 3 shows a diagrammatic sectional illustration of a third exemplary embodiment of a component according to the invention, FIG. 4 shows a diagrammatic plan view of the third exemplary embodiment of a component according to the invention.

DETAILED DESCRIPTION OF THE DRAWINGS

Figure 5A:
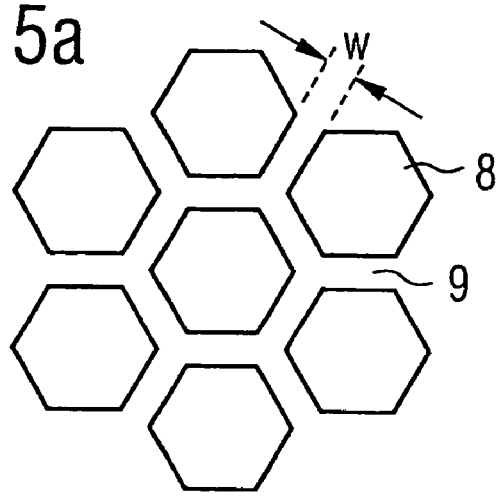
FIGS. 5a to 5g show seven variants of a fourth exemplary embodiment of a component according to the invention.
Figure 5B:
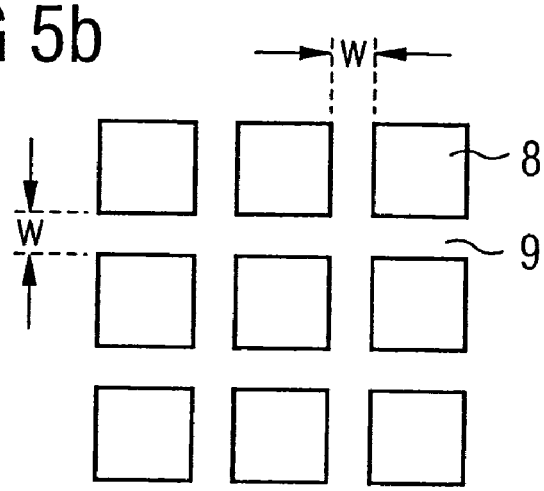
Figure 5C:
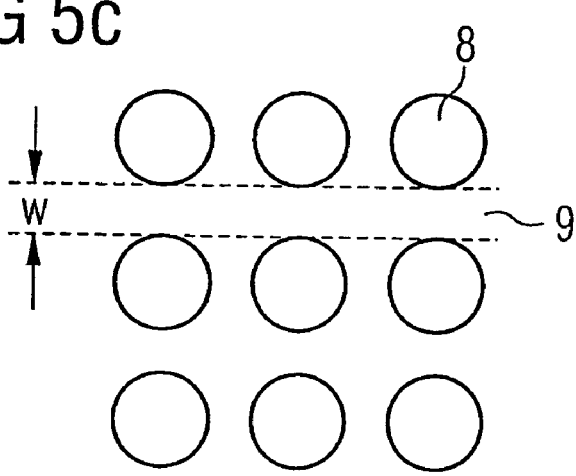

Identical or identically acting elements are provided with the same reference symbols in the Figures.

The exemplary embodiment of a component according to the invention as illustrated in FIG. 1 has a semiconductor body 1 applied to a surface 7 of a substrate 2. On the main area 9 remote from the substrate 2, the semiconductor body 1 is provided with a contact metalization 4. Furthermore, a pn junction 6 is formed in the semiconductor body 1, which pn junction is arranged essentially parallel to the substrate surface 7 and extends as far as the side areas 10 of the semiconductor body 1 that run from the main area 9 to the substrate surface 7.

The semiconductor body 1 is preferably formed in multilayered fashion. In this case, the individual layers may contain nitride compound semiconductors such as, for example GaN, AlN, InN, $Al_xGa_{1-x}N$, $0 \leq x \leq 1$, $In_xGa_{1-x}N$, $0 \leq x \leq 1$ or $Al_xIn_yGa_{1-x-y}N$, $0 \leq x \leq 1$, $0 \leq y \leq 1$, $0 \leq x+y \leq 1$.

In order to form the pn junction, the semiconductor body or the semiconductor layer sequence contained therein is partly n-doped on the side facing the substrate and p-doped on the side remote from the substrate. Silicon, for example, is suitable as the n-type doping and magnesium, for example, as the p-type doping. Such semiconductor layers may be produced by epitaxial deposition on a suitable substrate, preferably a silicon carbide substrate or a sapphire substrate.

A platinum or palladium metal layer, distinguished by its comparatively high hydrogen permeability, is suitable, in particular, as the contact metalization 4. In the exemplary embodiment shown, the contact metalization 4 is formed in unpatterned fashion on the main area 9 of the semiconductor body 1. In this case, the contact metalization is made so thin that it has a sufficient permeability to hydrogen. In particular, layer thicknesses of between 5 nm and 20 nm are suitable for this.

The semiconductor body is provided on all sides with a protective layer 3, which may comprise silicon oxide or silicon nitride, for example. Said protective layer 3 serves to protect the contact metalization from mechanical damage. This is expedient in particular for the thin contact metalizations mentioned. Otherwise, even during production, such thin contact metalizations are at risk of damage caused by subsequent process steps.

Furthermore, the protective layer 3 covers the pn junction 6 uncovered at the side areas 10 of the semiconductor body 1 and thus prevents electrical flashovers between the n-conducting and p-conducting sides from taking place at the side areas of the semiconductor body.

A plurality of recesses 5 lying near to one another are formed in the protective layer 3. Said recesses 5 ensure that the protective layer 3 is permeable to hydrogen and thus does not obstruct hydrogen from passing out of the semiconductor body 1.

The invention is particularly advantageous for semiconductor bodies with hydrogen impurities. In particular nitride-based semiconductor bodies, for example based on gallium nitride, often have a certain residual hydrogen content.

Although the residual hydrogen content remaining in the semiconductor body can also be driven out by means of suitable methods in the context of production, this leads to an additional production effort. Furthermore, driving hydrogen out of the semiconductor body may adversely influence other component properties, so that additional technical problems arise.

A particular problem brought about by the hydrogen content is that the hydrogen situated in the semiconductor body can become mobile at relatively high temperatures such as may occur for example during production or else during operation of the component. If this mobile hydrogen accumulates in magnesium-doped regions of the semiconductor body, then it preferably binds to magnesium defects. This blocks the electrical activation of said defects with the consequence that the magnesium defects do not emit any p-type charge carriers. This ultimately brings about the above-described increase in the forward voltage of the component.

It has been found, moreover, that hydrogen preferably accumulates in magnesium-doped regions of gallium-nitride-based semiconductor bodies.

If such a semiconductor body is encapsulated with a closed protective layer, then the protective layer acts as a barrier to the hydrogen enclosed in the semiconductor body and supports the disadvantageous increase in the forward voltage. The invention, by contrast, ensures that the protective layer is permeable to hydrogen on account of the recesses. The increase in the forward voltage is correspondingly significantly lower than in the case of a component according to the prior art. A further advantage of the invention consists in the fact that the above-described accumulation of hydrogen is avoided or at least reduced even in the event of a temperature loading. Therefore, a component according to the invention can be exposed to higher temperature loadings than a component according to the prior art both during production and during operation.

FIG. 2 shows a second exemplary embodiment of a component according to the invention. In contrast to the first exemplary embodiment, here the contact metalization 4 is made thicker and provided with a plurality of recesses 8 lying near to one another. In an advantageous manner, in this exemplary embodiment it is also possible to use contact metalizations which, as a continuous area, are not permeable to hydrogen, for example gold contact metalizations having a thickness of more than 1 µm. Furthermore, the thickness and manufacturing tolerance of the contact metalization can be chosen to be greater than in the case of the first exemplary embodiment, thereby reducing the production effort for the application of the contact metalization 4.

In the second exemplary embodiment, the hydrogen permeability of the contact metalization is ensured by the recesses 8 in the contact metalization 4. Preferably, the recesses 5 in the protective layer 3 are arranged in such a way that, in plan view, they are congruent with, or at least overlap, the recesses 8 in the contact metalization 4 or, as illustrated in section, are arranged above the recesses 8 in the contact metalization 4.

A third exemplary embodiment of a component according to the invention is diagrammatically illustrated in section in FIG. 3, and FIG. 4 shows the associated plan view, including a bondpad 21.

In this exemplary embodiment, only the side areas running from the substrate 2 to the main area 9 of the semiconductor body 1 are covered with the protective layer 3. This has the effect of covering the uncovered pn junction 6 at the side areas 10 and reducing the risk of an electrical flashover in this region.

The contact metalization on the main area 9 of the semiconductor body 1 is made sufficiently thick, so that there is no need for a protective layer as protection from mechanical damage. In particular, contact layers having a thickness of approximately 100 nm up to a few micrometers are suitable for this.

The hydrogen permeability of the contact metalization is ensured by the—circular in plan view—recesses 8 in the contact metalization. Platinum or palladium is again preferably used as material for the contact metalization. The exemplary embodiment shown in FIG. 3 and FIG. 4 corresponds to the abovementioned second embodiment of the invention.

FIG. 5 shows seven variants for the arrangement of the recesses 5 in the protective layer or the recesses 8 in the contact metalization. Thus, the recesses may be for example hexagonal, FIG. 5a, square, FIG. 5b, or circular, FIG. 5c. The recesses are in each case arranged near to one another in grid-fashion and are separated from one another by webs 9 having a width w. In this case webs having a width w of between 1 μm and 4 μm have proved to be particularly advantageous with regard to the hydrogen permeability of the contact metalization.

Figure 5D:
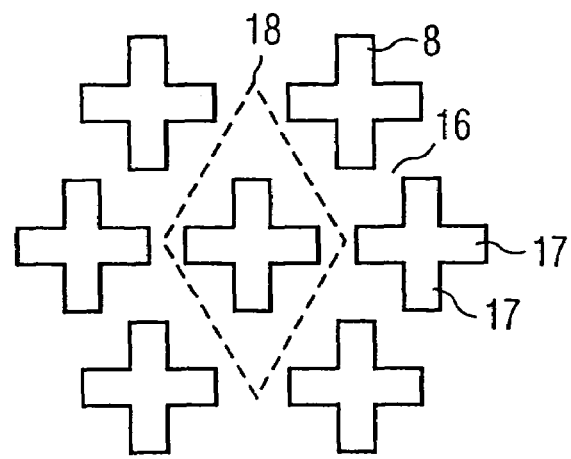
Figure 5E:
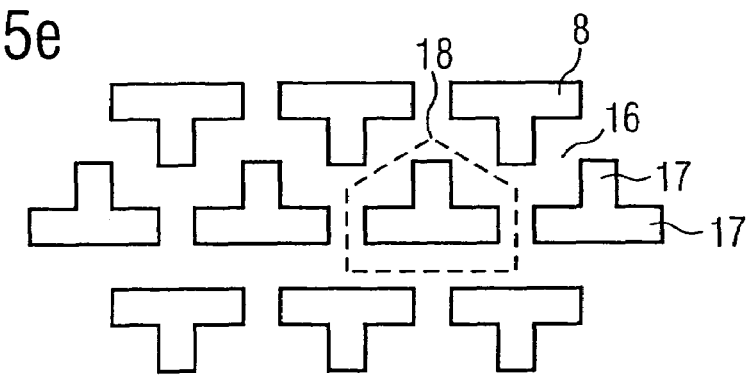
Figure 5F:
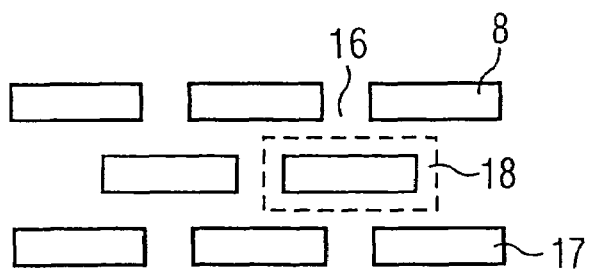
Figure 5G:
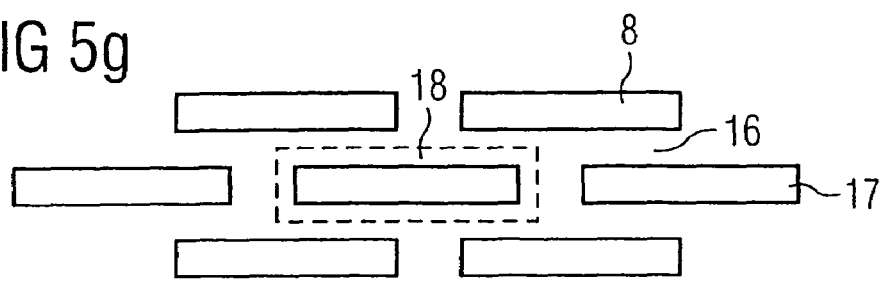

More widely, the recesses may also be embodied in the form of crosses, FIG. 5d, T-shaped openings, FIG. 5e, rectangles, FIG. 5f, or elongated slots, FIG. 5g. In the case of the variants illustrated in FIGS. 5d, 5e, 5f and 5g, an elementary cell 18 is assigned to each recess in the contact metalization. In order to obtain an arrangement of recesses that is as dense as possible, the elementary cells 18 are arranged near to one another in grid-like fashion in such a way as to cover the area.

Figure 6:
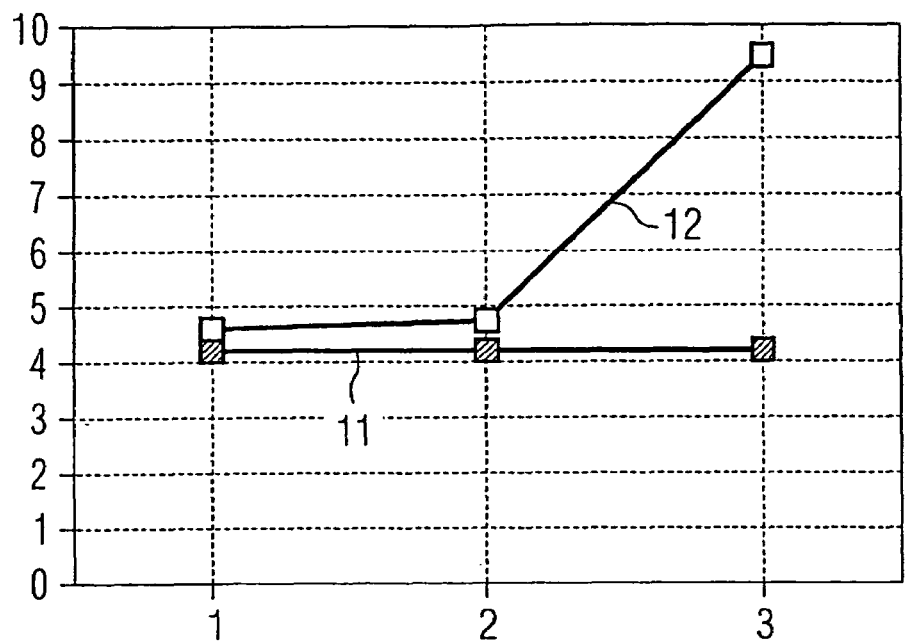
FIG. 6 shows a graph plotting the forward voltage of a component according to the invention for various production steps in comparison with a component according to the prior art.

FIG. 6 illustrates the forward voltage of a component according to the invention as a function of various process steps during production in comparison with a component according to the prior art. Point 1 on the abscissa identifies a component with a closed protective layer, at point 2 the protective layer was opened in the case of the component according to the invention, i.e. a plurality of recesses were formed in the protective layer, and point 3 identifies a thermal treatment at 300° C. for a duration of 20 minutes.

Line 11 or the associated measured values indicate the forward voltage for a component according to the invention, and line 12 and associated measured values indicate the corresponding forward voltage for a component according to the prior art. The components essentially have the structure illustrated in FIG. 2, a plurality of cross-shaped recesses in accordance with FIG. 5d being formed in the contact metalization. In the case of the component according to the invention, at point 2 on the abscissa, the structure of the contact metalization was transferred to the structure of the protective layer, so that the degree of coverage of the protective layer in the region of the contact metalization was reduced from initially 100% to 42%. Such an opening of the protective layer was not performed in the case of the component according to the prior art.

As illustrated, in the case of the component according to the prior art, after the thermal treatment, the forward voltage rises from initially approximately 4 V to more than 9 V, which consequently leads to a total failure of the component. By contrast, in the case of the component according to the invention, line 11 and associated measured values, the forward voltage is essentially constant.

Figure 7:
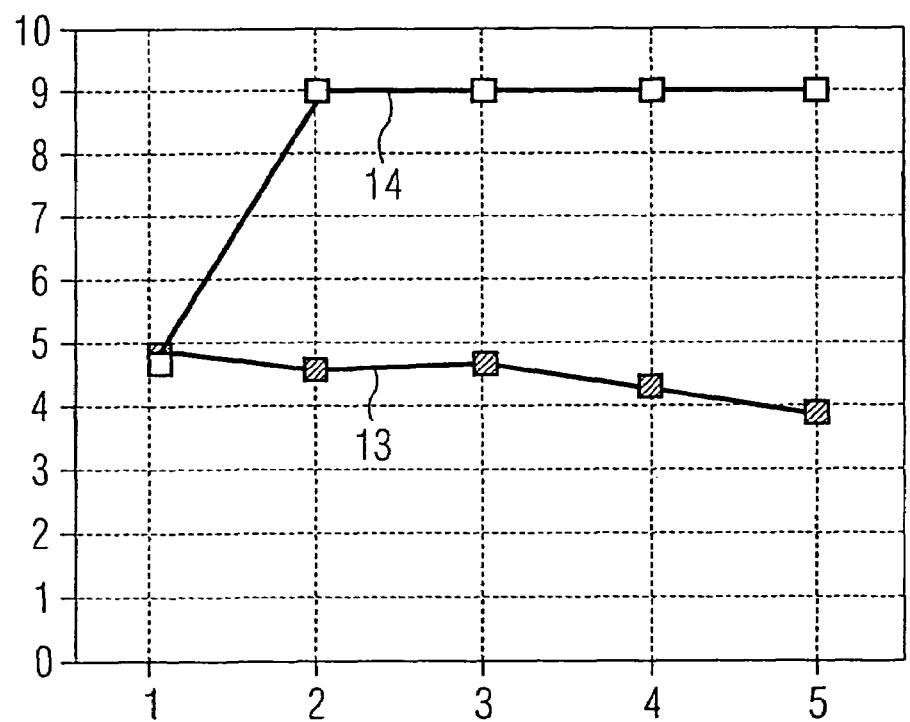
FIG. 7 shows a graph illustrating the forward voltage of a component according to the invention for various production steps in comparison with a component according to the prior art.

FIG. 7 illustrates a similar illustration of the forward voltage of a component according to the invention in comparison with a component according to the prior art. The points 2, 3, 4 and 5 plotted on the abscissa correspond to a more extensive thermal treatment of the component at 300° C. for 20 minutes, at 350° C. for 15 minutes, at 350° C. for 45 minutes and at 350° C. for 120 minutes.

A significant rise in the forward voltage, to approximately 9 V, can again be ascertained in the case of the component according to the prior art, line 14 and associated measured values, which leads to a total failure of the component. By contrast, in the case of the component according to the invention, line 13 and associated measured values, the forward voltage remains essentially constant.

It goes without saying that the explanation of the invention on the basis of the exemplary embodiments illustrated is not to be understood as a restriction of the invention thereto.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A semiconductor component comprising:
   a semiconductor body containing a nitride compound semiconductor;
   a contact metalization on the semiconductor body and having a side which faces away from the semiconductor body; and
   a protective layer arranged on said side of the contact metalization which faces away from the semiconductor body,
   wherein the protective layer has a plurality of recesses through which hydrogen can pass.

2. The semiconductor component as claimed in claim 1, wherein the contact metalization has a plurality of recesses arranged near to one another.

3. The semiconductor component as claimed in claim 2, wherein the recesses in the contact metalization are separated from one another by webs having a width of between 1 μm and 5 μm.

4. The semiconductor component as claimed in claim 1, wherein the contact metalization has a plurality of recesses arranged near to one another and has a thickness of between 100 nm and 5 μm.

5. The semiconductor component as claimed in claim 1, wherein the contact metalization has a plurality of recesses arranged near to each other, and wherein the recesses in the protective layer overlap the recesses in the contact metalization in plan view.

6. The semiconductor component as claimed in claim 5, wherein the recesses in the protective layer and the recesses in the contact metalization have the same form and are arranged congruently above one another.

7. A semiconductor component comprising:
a semiconductor body containing a nitride compound semiconductor;
a contact metalization on the semiconductor body; and
a pn junction,
wherein the pn junction is laterally bounded by side areas of the semiconductor body,
wherein the side areas of the semiconductor body are at least partly provided with a protective layer which at least partly covers the pn junction uncovered at the side areas, and
wherein the contact metalization has a plurality of recesses arranged near to one another thereby allowing hydrogen to pass through the contact metalization.

8. The semiconductor component as claimed in claim 7, wherein the contact metalization is at least partly not covered by the protective layer.

9. The semiconductor component as claimed in claim 7, wherein the recesses in the contact metalization are separated from one another by webs having a width of between 1 μm and 5 μm.

10. The semiconductor component as claimed in claim 1 or claim 7, wherein the nitride compound semiconductor is a nitride compound having elements of the third and/or fifth main group of the periodic table.

11. The semiconductor component as claimed in claim 10, wherein the nitride compound is one of the compounds GaN, AlN, InN, $Al_xGa_{1-x}N$, $0 \leq x \leq 1$, $In_xGa_{1-x}N$, $0 \leq x \leq 1$ and $Al_xIn_yGa_{1-x-y}N$, $0 \leq x \leq 1$, $0 \leq y \leq 1$, $0 \leq x+y \leq 1$.

12. The semiconductor component as claimed in claim 1 or claim 7, wherein the semiconductor body has a p-conducting partial region and the contact metalization is arranged on a surface of the p-conducting partial region of the semiconductor body.

13. The semiconductor component as claimed in claim 1 or claim 7, wherein the protective layer contains silicon oxide or silicon nitride.

14. The semiconductor component as claimed in claim 1 or claim 7, wherein the contact metalization is hydrogen-permeable.

15. The semiconductor component as claimed in claim 1 or claim 7, wherein the contact metalization contains palladium, platinum, nickel or gold.

16. The semiconductor component as claimed in claim 1 or claim 7, wherein the contact metalization has a thickness of between 1 nm and 100 nm.

17. The semiconductor component as claimed in claim 1 or claim 7, wherein the semiconductor component is a radiation-emitting component.

18. The semiconductor component as claimed in claim 17, wherein the semiconductor component is a light-emitting diode or a laser diode.

19. The semiconductor component as claimed in claim 17, wherein the contact metalization is radiation-transmissive.

\* \* \* \* \*